United States Patent
Sakamoto (10) Patent No.: US 12,276,550 B2
(45) Date of Patent: Apr. 15, 2025

(54) INFRARED SENSING DEVICE AND VARIABLE RESISTANCE FILM INCLUDED IN THE SAME

(71) Applicants: KYOTO UNIVERSITY, Kyoto (JP); OPTMASS CO., LTD., Kyoto (JP)

(72) Inventor: Masanori Sakamoto, Kyoto (JP)

(73) Assignees: KYOTO UNIVERSITY, Kyoto (JP); OPTMASS CO., LTD., Kyoto (JP)

( * ) Notice: Subject to any disclaimer, the term of this patent is extended or adjusted under 35 U.S.C. 154(b) by 218 days.

(21) Appl. No.: 17/996,046

(22) PCT Filed: Apr. 13, 2021

(86) PCT No.: PCT/JP2021/015365
§ 371 (c)(1),
(2) Date: Oct. 12, 2022

(87) PCT Pub. No.: WO2021/210593
PCT Pub. Date: Oct. 21, 2021

(65) Prior Publication Data
US 2023/0184592 A1    Jun. 15, 2023

(30) Foreign Application Priority Data
Apr. 13, 2020 (JP) ................... 2020-071711

(51) Int. Cl.
*G01J 5/22* (2006.01)
*G01J 5/58* (2022.01)

(52) U.S. Cl.
CPC .. *G01J 5/22* (2013.01); *G01J 5/58* (2013.01)

(58) Field of Classification Search
CPC ...... G01J 5/22; G01J 5/58; G01J 5/046; G01J 5/20; H01L 31/02327; H01L 31/09; H01L 31/101
See application file for complete search history.

(56) References Cited

U.S. PATENT DOCUMENTS

| | | | |
|---|---|---|---|
| 5,900,631 A * | 5/1999 | Sano | H01L 31/09 257/E31.093 |
| 9,091,591 B2 * | 7/2015 | Park | G01J 5/023 |

(Continued)

FOREIGN PATENT DOCUMENTS

| | | |
|---|---|---|
| JP | H1062239 A | 3/1998 |
| JP | 2001013010 A | 1/2001 |
| JP | 2001183230 A | 7/2001 |
| JP | 2008139072 A | 6/2008 |

(Continued)

OTHER PUBLICATIONS

Extended European Search Report issued for European Patent Application No. 21788628.2, dated Sep. 11, 2023, 8 pages.

(Continued)

*Primary Examiner* — David P Porta
*Assistant Examiner* — Gisselle M Gutierrez
(74) *Attorney, Agent, or Firm* — HSML P.C.

(57) ABSTRACT

The present disclosure provides an infrared sensing device having a simple structure and being capable of detecting an infrared ray. A device 300 includes a variable resistance portion 13 whose electrical resistance varies in response to an infrared ray and a detection portion that detects the variation of the electrical resistance of the variable resistance portion. The variable resistance portion satisfies at least one of i) inclusion of a material potentially absorbing an infrared ray by localized surface plasmon resonance, and ii) reception of a carrier from a carrier supply portion 23 including the above material and being in contact with the variable resistance portion, the carrier being an electron and/or a hole, the carrier being generated by irradiation of the carrier supply portion with an infrared ray.

18 Claims, 8 Drawing Sheets

(56) References Cited

U.S. PATENT DOCUMENTS

| | | | |
|---|---|---|---|
| 10,944,065 B2* | 3/2021 | Lhuillier | H01L 31/035209 |
| 2009/0262778 A1* | 10/2009 | Ikushima | G01J 5/12 |
| | | | 374/121 |
| 2010/0067016 A1* | 3/2010 | Ueno | G01J 5/02 |
| | | | 977/773 |
| 2013/0087707 A1* | 4/2013 | Park | G01J 5/023 |
| | | | 250/338.4 |
| 2013/0161515 A1* | 6/2013 | Park | G01J 5/023 |
| | | | 250/338.1 |
| 2014/0217289 A1* | 8/2014 | Nam | G01J 5/0818 |
| | | | 250/353 |
| 2017/0334735 A1 | 11/2017 | Machida et al. | |
| 2019/0178718 A1* | 6/2019 | Kawasaki | G01J 5/06 |
| 2019/0186969 A1* | 6/2019 | Chen | G01F 1/6847 |
| 2020/0006582 A1 | 1/2020 | Sakamoto et al. | |

FOREIGN PATENT DOCUMENTS

| | | | | |
|---|---|---|---|---|
| JP | 2012164980 A | | 8/2012 | |
| JP | 2018524820 A | | 8/2018 | |
| JP | 2019002852 A | | 1/2019 | |
| WO | 2016067905 A1 | | 5/2016 | |
| WO | 2017017238 A1 | | 2/2017 | |
| WO | WO2018101446 A1 | * | 6/2018 | H01L 31/03365 |
| WO | 2018193045 A1 | | 10/2018 | |

OTHER PUBLICATIONS

International Search Report and Written Opinion issued for International Patent Application No. PCT/JP2021/015365, Date of mailing: Jul. 6, 2021, 11 pages including English translation of Search Report.

* cited by examiner

INFRARED SENSING DEVICE AND VARIABLE RESISTANCE FILM INCLUDED IN THE SAME

TECHNICAL FIELD

The present invention relates to a device for detecting infrared or an infrared ray and a variable resistance film included in the device.

BACKGROUND ART

With the progress of a smart society, demands for various sensing devices have been increasing. In particular, infrared sensing devices are becoming more and more important in a wide range of fields such as information communication, temperature measurement, and living body detection.

Devices using a material whose electrical resistance increases as the temperature thereof rises by irradiation with infrared rays is known as infrared sensing devices. In this type of devices, metals such as platinum, titanium, and copper and oxide semiconductors such as vanadium oxide are commonly used as variable resistance materials. Infrared sensing devices including these materials are called bolometers, which have been under development for incorporation in, particularly, image formation apparatuses (e.g., Patent Literature 1).

CITATION LIST

Patent Literature

Patent Literature 1: JP 2001-013010 A

SUMMARY OF INVENTION

Technical Problem

However, as described in Patent Literature 1, bolometers disadvantageously have a complex structure because, to cancel the effect of heat from the surrounding environment, a standard resistor is provided in addition to a thermal resistor that detects an infrared ray. The present invention aims to provide a new infrared sensing device having a simple structure but being capable of detecting an infrared ray.

Solution to Problem

The present inventor has found out that the electrical resistance of a material potentially absorbing an infrared ray by localized surface plasmon resonance (LSPR) (the material may be referred to as "LSPR-IR absorbing material" hereinafter) can quickly vary by irradiation with an infrared ray and that the electrical resistance of a portion to which voltage can be applied can quickly vary by supplying the portion with an electron and/or a hole generated in an LSPR-IR absorbing material by irradiation with an infrared ray. The present inventor has completed the present invention on the basis of these findings. These variations in electrical resistance can occur even at a constant temperature.

That is, the present invention provides an infrared sensing device including:
 a variable resistance portion whose electrical resistance varies in response to irradiation of the infrared sensing device with an infrared ray; and
 a detection portion that detects the variation of the electrical resistance of the variable resistance portion, wherein the variable resistance portion satisfies at least one selected from the group consisting of:
 i) inclusion of a material potentially absorbing an infrared ray by localized surface plasmon resonance; and
 ii) reception of a carrier from a carrier supply portion including the material and being in contact with the variable resistance portion, the carrier being an electron and/or a hole, the carrier being generated by irradiation of the carrier supply portion with an infrared ray.

The present invention also provides a variable resistance film including: a material potentially absorbing an infrared ray by localized surface plasmon resonance, wherein
 in the case where irradiation of the variable resistance film with an infrared ray starts and then stops during application of voltage to the variable resistance film, the electrical resistance increases in response to the start of the irradiation and the electrical resistance decreases in response to the stop of the irradiation, or the electrical resistance decreases in response to the start of the irradiation and the electrical resistance increases in response to the stop of the irradiation.

This variable resistance film is particularly useful as a variable resistance film for infrared sensing devices.

The present invention also provides an infrared transmittance measurement apparatus including:
 the infrared sensing device according to the present invention; and
 a light source that irradiates the infrared sensing device with light including an infrared ray, wherein
 the infrared sensing device detects an infrared ray having been emitted by the light source to irradiate a measurement specimen and having been transmitted through the measurement specimen.

Advantageous Effects of Invention

The present invention can provide an infrared sensing device having a simple structure and being capable of quickly detecting an infrared ray. The device according to the present invention is used most effectively in the field of infrared detection, and can also be used, as shown in later-described examples, as a light sensing device capable of detecting shorter-wavelength light, namely, light in a visible region and an ultraviolet region, as well.

DESCRIPTION OF EMBODIMENTS

The term "infrared ray" herein means an electromagnetic wave with a wavelength of 0.7 to 1000 µm. The term "semiconductor" as used herein includes not only common semiconductors but also doped semiconductors, semimetals, and degenerate semiconductors. The term "semimetal" refers to a substance having a band structure in which a bottom portion of a conduction band and an upper portion of a valence band slightly overlap each other across the Fermi level due to distortion of a crystal structure, interaction between crystalline layers, or the like. The term "degenerate semiconductor" refers to a substance having a band structure in which a conduction band or a valence band and the Fermi level overlap each other. The term "nanoparticle" means a particle having a smallest diameter of less than 1 µm, for example, 0.1 nm or more and less than 1 µm. The term "nanoparticle" typically means a particle having a largest dimension of 5 µm or less, or even 3 nm to 2 µm. The "smallest diameter" of a particle is defined by the smallest dimension through the center of gravity of the particle, while the "largest dimension" of a particle is defined by the longest line segment that can be set in the particle. The term "functional group" as used herein includes a halogen atom too.

The device according to the present invention may include an electrode group that applies voltage to a variable resistance portion. The electrode group may include a first electrode and a second electrode, the first electrode being electrically connected to a positive electrode of a power source, the second electrode being electrically connected to a negative electrode of the power source. Both the first electrode and the second electrode may be directly connected to the variable resistance portion and/or a carrier supply portion. Both the first electrode and the second electrode can be directly connected to the variable resistance portion even in an embodiment in which the carrier supply portion is included.

The device according to the present invention may further include a power source that supplies voltage to the electrodes. However, the voltage may be supplied from a power source external to the device.

In one embodiment of the present invention, in the case where irradiation of the variable resistance portion with an infrared ray starts and then stops during application of voltage to the variable resistance portion from the electrode group that applies voltage to the variable resistance portion, the electrical resistance increases in response to the start of the irradiation and the electrical resistance decreases in response to the stop of the irradiation. In this embodiment, the variable resistance portion may include an infrared-absorbing film including the above-described material and being a single-layer film. Additionally, the variable resistance portion may include, as the above-described material, a compound including copper and a chalcogen element excluding oxygen. This compound is copper sulfide, copper selenide, or the like. The variable resistance portion may include, for example, nanoparticles of copper sulfide.

In another embodiment of the present invention, in the case where irradiation of the variable resistance portion with an infrared ray starts and then stops during application of voltage to the variable resistance portion from the electrode group that applies voltage to the variable resistance portion, the electrical resistance decreases in response to the start of the irradiation and the electrical resistance increases in response to the stop of the irradiation. In this embodiment, the infrared sensing device may include the carrier supply portion, and the carrier supply portion and the variable resistance portion may form a laminate structure. Additionally, the carrier supply portion and the variable resistance portion may be formed of different semiconductor materials. Moreover, the variable resistance portion may include, as the above-described material, tungsten oxide doped with cesium (cesium-doped tungsten oxide). The variable resistance portion may include, for example, nanoparticles of cesium-doped tungsten oxide.

In one embodiment of the present invention, the variable resistance portion includes a semiconductor material that receives a carrier from the carrier supply portion including semiconductor nanoparticles, the carrier being an electron and/or a hole, the carrier being generated by irradiation of the carrier supply portion with an infrared ray.

A relaxation time from localized surface plasmon excitation is several tens of femtoseconds to several hundreds of picoseconds for most of LSPR-IR absorbing materials (infrared response LSPR materials). On the other hand, a long-lived component having a lifetime of 1 ns or longer is included in the relaxation time for, for example, copper sulfide and cesium-doped tungsten oxide. It is thought that infrared irradiation of LSPR-IR absorbing materials that can have such a long relaxation time causes a transient transition of electronic state and the transient transition contributes to an increase or decrease in electrical resistance. That is, in one embodiment of the present invention, the LSPR-IR absorbing material is a material for which 1 ns or longer can be measured as a relaxation time from localized surface plasmon excitation. A later-described second material does not need to be used in an embodiment in which such a material is used.

When the LSPR-IR absorbing material having a relaxation time that is not as long as the above is used, material-to-material carrier movement may be utilized. That is, in one embodiment of the present invention, the variable resistance portion includes a first material being the LSPR-IR absorbing material and a second material receiving a carrier being an electron and/or a hole, the carrier being generated by irradiation of the first material with an infrared ray.

In one embodiment of the present invention, the first material and the second material are each a transparent electrically conductive oxide. This embodiment is suitable for providing a device that is transparent to visible light. However, as described later, a good transparency to visible light can be achieved also in an embodiment in which nanoparticles of copper sulfide are used.

In one embodiment of the present invention, the variable resistance portion is a variable resistance film, and is particularly a single-layer film. However, the variable resistance film may be a laminate film including two or more layers. For example, the variable resistance portion and the carrier supply portion may form the laminate film. Herein, a film formed by supplying a raw material more than once is also treated as a "single-layer film" as long as the film appears to be a single layer.

In an embodiment in which the first material and the second material are included, the second material may be included in the form of nanoparticles. In addition to this, the first material may be included in the form of nanoparticles. Not only in this embodiment, the material potentially absorbing an infrared ray by localized surface plasmon resonance may be included in the form of nanoparticles in the present invention.

The first material and the second material may each be semiconductor materials. The second material is preferably, but not particularly limited to, a semiconductor having a higher electrical resistivity than that of the first material. The first material and the second material may be semiconductor materials of the same type or may be semiconductor materials of different types.

In one embodiment of the present invention, the variable resistance portion is free of graphite and a carbon nanotube. The variable resistance portion does not need an electrically conductive carbon material, and may be free of an electrically conductive material such as an electrically conductive carbon material or a metal material.

The variable resistance portion may be a portion whose electrical resistance increases or decreases before start of irradiation with an infrared ray substantially causes the temperature of the variable resistance portion to start rising. To prevent the electrical resistance variation caused by the temperature rise, the device according to the present invention may be connected to a temperature controller having a cooling function or a member that is designed as a heat sink or that can function as a heat sink. The device may further include a heat sink, a member having the function of a heat sink, or a temperature controller as a heat release member that releases heat of the variable resistance portion to an outside of the device. The member having the function of a heat sink is, for example, a substrate for formation of a film including the variable resistance portion. The temperature controller having a cooling function is, for example, a Peltier device. The above specific examples of the heat release member are mentioned as examples, and the heat release member is not limited to these.

In one embodiment of the present invention, the infrared sensing device further includes a cover portion that transmits at least a portion of an infrared ray with which the infrared sensing device is irradiated. The cover portion may include a base and at least one selected from the group consisting of an optical filter portion and a specimen placement portion, the at least one being supported by the base. The cover portion may block a portion of infrared rays with which the device is irradiated. The cover portion can block an infrared ray in its partial region or in a portion of the wavelength region.

In one embodiment of the present invention, the variable resistance portion can have a high transmittance in a visible region between wavelengths of 400 nm and 800 nm. The transmittance in the visible region is, for example, 65% or more, 70% or more, even 75% or more, and particularly 80% or more.

Hereinafter, embodiments of the present invention will be further described with reference to the drawings as needed. The following description is not intended to limit the present invention to specific embodiments. Members and components shown in one figure and being common to another figure are denoted by the same reference characters in the figures and will not be described repeatedly.

(Configuration of Device)

Figure 1:
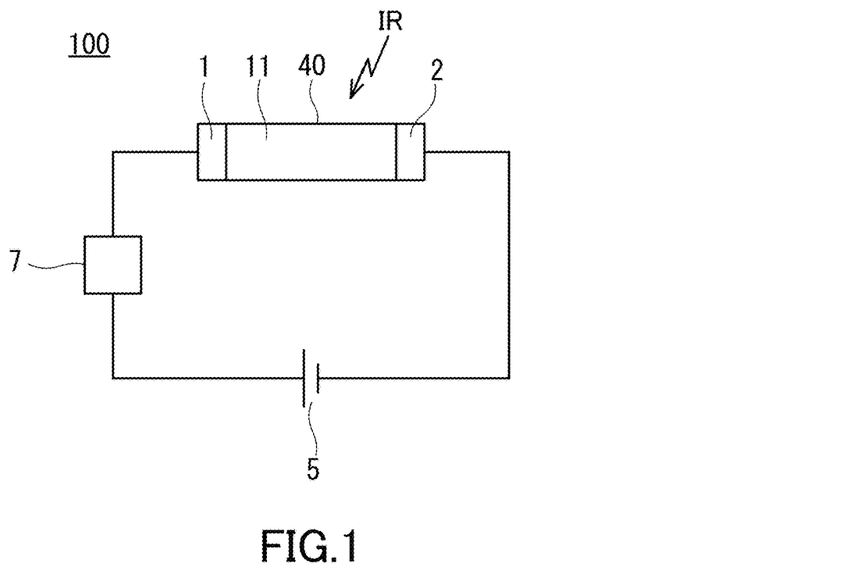
FIG. 1 schematically shows a configuration of one embodiment of a device of the present invention.

An infrared sensing device 100 shown in FIG. 1 includes a variable resistance portion 11, a first electrode 1 and a second electrode 2 that apply voltage to the variable resistance portion 11. Voltage is supplied to the electrodes 1 and 2 from a power source 5. The power source 5 is, for example, a DC power source. An electrical circuit including the variable resistance portion 11, the electrodes 1 and 2, and the power source 5 is provided with a measurement portion 7. The device 100 may include an electronic component such as a switching device, a memory portion that memorizes a measurement result, a display portion that displays a measurement result, a control portion that controls a portion or a component, and the like, which are not illustrated. In this embodiment, an electrical resistance variation in the variable resistance portion 11 is detected using the electrodes 1 and 2 and the measurement portion 7. In other words, a detection portion that detects an electrical resistance variation includes the measurement portion 7 and an electrode group including the electrodes 1 and 2.

The variable resistance portion 11 is placed to be able to receive an infrared IR ray. An infrared IR ray is incident on an infrared-receiving face 40 of the variable resistance portion 11. The electrical resistance of the variable resistance portion 11 varies in response to the start of the irradiation of the infrared IR ray, and the measurement portion 7 detects a variation occurring in response to the electrical resistance variation. The measurement portion 7 detects the irradiation of the infrared IR ray, for example, on the basis of an electric current variation in the circuit or a potential variation at the location of the measurement portion 7. The measurement portion 7 also detects a variation occurring in response to stop of the irradiation of the infrared IR ray. The measurement portion 7 detects an IR-irradiated state and/or an IR-unirradiated state in this manner. Known electronic devices, known circuits, and the like can be used as the measurement portion 7 without any particular limitation. The measurement portion 7 basically detects an infrared ray while voltage is being supplied to the variable resistance portion 11 from the power source 5 through the electrodes 1 and 2.

The device 100 may further include a calculation portion that calculates the intensity of the infrared IR ray, the temperature of a light source or heat source having emitted the infrared IR ray, and other values on the basis of a potential variation, etc. measured by the measurement portion 7. The calculation portion may have a function of measuring the infrared absorptance of a measurement specimen, the infrared-absorbing component content in a measurement specimen, and the like, particularly when the device 100 is designed to allow placement of a measurement specimen that absorbs a portion of infrared IR rays from a light source. The calculation portion can be formed by combining an MPU (micro-processing unit), a memory, and the like as appropriate. The measurement specimen may be a non-living object, or may be a living body, specifically a part of a living body.

The variable resistance portion 11 may be formed as a variable resistance film. The variable resistance film may be arranged together with the electrodes 1 and 2 on a substrate which is not illustrated. The variable resistance film can be formed by a method not requiring a reduced pressure atmosphere, as shown in examples described later. The variable resistance film can be formed specifically by a liquid-phase film formation method such as application, dipping, or spraying. The substrate is suitably, for example, an insulating substrate formed of a glass, a resin, a ceramic, or the like. The substrate may be formed of a material capable of transmitting an infrared ray in a target wavelength region, and, specifically, a glass sheet, a resin sheet, or the like may be used. In the case where heat release to the substrate is not enough to sufficiently prevent a temperature-induced variation of the electrical resistance of the variable resistance portion, an additional heat release member such as a heat sink may be connected to the substrate, or heat release from the variable resistance portion may be promoted using a temperature controller such as a Peltier device or an air blower as an additional heat release member.

The substrate may be formed of at least one material selected from the group consisting of a woven fabric, a non-woven fabric, a felt, a knitting, paper, and a film. Since these materials are light in weight and foldable, these materials are suitable for portable or wearable devices. The material of the substrate is not limited to the above materials. The substrate may be formed of a semiconductor typified by silicon, or may be a substrate including an insulating coating arranged on a surface of a metal plate that functions as a heat sink. A control circuit of the device 100, for example, may be arranged on the semiconductor substrate.

In the case of a bolometer whose resistance varies in reaction to a temperature variation, the substrate should have, for improvement of the response speed, a heat-insulation structure, such as a beam structure, to which an MEMS technology is applied. However, the device 100 can achieve a sufficiently fast response speed without a complex heat-insulation structure.

In the device 100, the first electrode 1 and the second electrode 2 are each directly connected to the variable resistance portion 11. The electrodes 1 and 2 are not necessarily in direct contact with the variable resistance portion 11 as long as voltage can be applied to the variable resistance portion 11 using the electrodes 1 and 2 and an electric current can flows through the variable resistance portion 11 by the voltage application. Unlike a photovoltaic device, a light-emitting device, and the like, however, in the device 100, a layer serving as a carrier injection layer or a carrier transport layer is not necessarily present between the variable resistance portion 11 and the electrode 1 and between the variable resistance portion 11 and the electrode 2.

The variable resistance portion 11 includes the LSPR-IR absorbing material. When the variable resistance portion 11 includes the LSPR-IR absorbing material whose relaxation time from localized surface plasmon excitation can be 1 ns or longer, even 10 ns or longer, and particularly 100 ns or longer, an infrared-irradiation-induced transient transition of electronic state of the LSPR-IR absorbing material increases or decreases the electrical resistance of the variable resistance portion 11 to such a level that the increase or decrease can be sufficiently detected.

When the variable resistance portion 11 does not include the LSPR-IR absorbing material whose relaxation time from localized surface plasmon excitation can be as long as the above, the variable resistance portion 11 desirably further includes the second material that receives a carrier being an electron and/or a hole generated by irradiation of the LSPR-IR absorbing material (the first material) by irradiation with an infrared ray.

Figure 2:
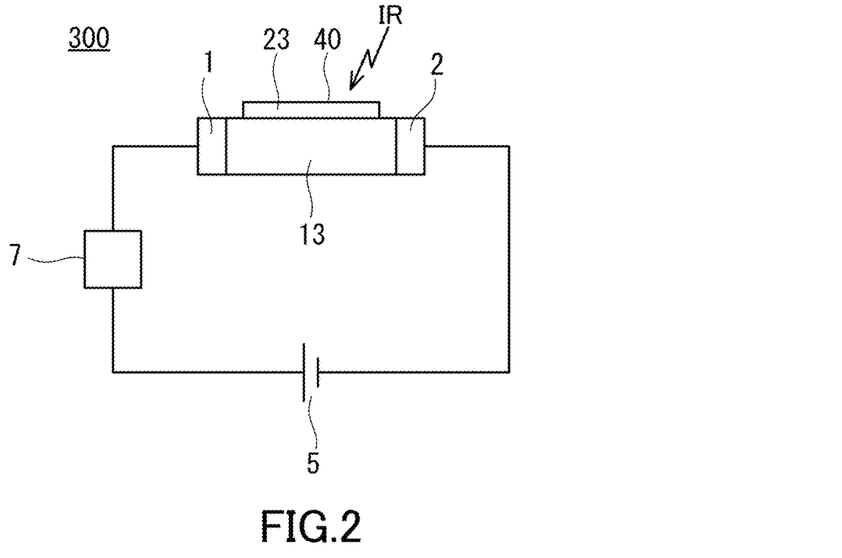
FIG. 2 schematically shows a configuration of another embodiment of the device of the present invention.

In an infrared sensing device 300 shown in FIG. 2, a carrier supply portion 23 is placed in contact with a variable resistance portion 13 and not in contact with the electrodes 1 and 2. In the device 300, the electrodes 1 and 2 are directly in contact with the variable resistance portion 13. The variable resistance portion 13 and the carrier supply portion 23 may be in contact with each other to form a laminate film.

It is desirable that the carrier supply portion 23 include the LSPR-IR absorbing material (the first material) and the variable resistance portion 13 include the second material. In the device 300, a carrier being an electron and/or a hole generated in the first material in response to start of irradiation of the carrier supply portion 23 is supplied to the second material of the variable resistance portion 13, and then the electrical resistance of the variable resistance portion 13 increases or decreases.

When a major carrier in the variable resistance portion 13 and the carrier supplied from the carrier supply portion 23 are of the same type, i.e., both carriers are negative electrons or positive holes, the electrical resistance of the variable resistance portion 13 decreases with an increase of the major carrier, the increase being caused in response to the start of the irradiation with the infrared ray. When a major carrier in the variable resistance portion 13 and the carrier supplied from the carrier supply portion 23 are of different types, i.e., one of the carriers is an electron and the other is a hole, the electrical resistance of the variable resistance portion 13 increases by carrier recombination in response to the start of the irradiation with the infrared ray.

Once the irradiation with the infrared ray stops, the electrical resistance of the variable resistance portion 13 basically returns to a state where the variable resistance portion 13 is not irradiated with an infrared ray. However, affected by, for example, a temperature rise, the electrical resistance of the variable resistance portion 13 does not return in some cases to the same resistance value as before the irradiation with the infrared ray. The device including the variable resistance portion 13 whose electrical resistance has not returned to the pre-irradiation state can also be used as a sensing device. As the variation occurring in response to the stop of the irradiation with the infrared ray, an increase in electrical resistance is measured in the case where the electrical resistance decreases in response to the start of the irradiation with the infrared ray, while a decrease in electrical resistance is measured in the case where the electrical resistance increases in response to the start of the irradiation with the infrared ray. The device 100 shown in FIG. 1 can also experience the above variations in electrical resistance.

A high responsivity of the LSPR-IR absorbing material allows the devices 100 and 300 to sufficiently quickly detect an electrical resistance increase or decrease caused in response to start and stop of irradiation with an infrared ray. In the case where a material having a long relaxation time from localized surface plasmon excitation is included in the variable resistance portion 11, it may take a little longer time for the device 100 to detect stop of irradiation with an infrared ray. However, also in this case, detection can be accomplished in the order of μs or a shorter time. In the device 300, by appropriately controlling band alignment of the material included in the variable resistance portion 13 and the material included in the carrier supply portion 23, the detection time can be made shorter also in the case where a material having a long relaxation time is included in the variable resistance portion 13. The device according to the present embodiment can detect start or stop of irradiation with an infrared ray, for example, in the order of ps or a shorter time.

The device according to the present embodiment can operate in air at ordinary temperature. Bolometers which are so-called thermal sensing devices can operate at ordinary temperature, but are inherently disadvantageous in terms of response speed, as is obvious from the operating principle. On the other hand, some of so-called quantum sensing devices respond at high speed, but virtually do not operate unless the devices are cooled to low temperatures. The device according to the present embodiment including the LSPR-IR absorbing material is practically useful in that the device according to the present embodiment achieves a fast response speed and is usable in a wide variety of environments. The device according to the present embodiment can have wavelength selectivity; that is, the device according to the present embodiment has a relatively high sensitivity to irradiation with a near-infrared ray with a wavelength of up to 2.5 µm and a relatively low sensitivity to an infrared ray with a wavelength beyond 2.5 µm. Such wavelength selectivity is an advantageous characteristic in terms of reducing noise by thermal conduction.

When the electrical resistance of the variable resistance portion 13 is too low, the above increase and decrease in electrical resistance, namely, photodoping-induced increase and decrease in electrical resistance do not appear noticeably. From this point of view, the second material is preferably a non-metal material, specifically a semiconductor material.

In FIG. 2, the electrodes 1 and 2 being the electrode group are not in contact with the carrier supply portion 23 and are both in contact with the variable resistance portion 13. However, arrangement of the electrode group, the variable resistance portion, and the carrier supply portion is not limited to the embodiment shown in FIG. 2 as long as a carrier being an electron and/or a hole generated by start of irradiation of the carrier supply portion with an infrared ray can be supplied to the variable resistance portion.

The semiconductor materials included in the variable resistance portion 13 and the carrier supply portion 23 may be of the same type, or may be of different types. That is, since the device is required to be configured so that a carrier generated in the carrier supply portion 23 will be transferred to the variable resistance portion 13, a required configuration is different from one required of, for example, a solar cell in which a p-n junction or Schottky barrier junction is essential.

Figure 13:
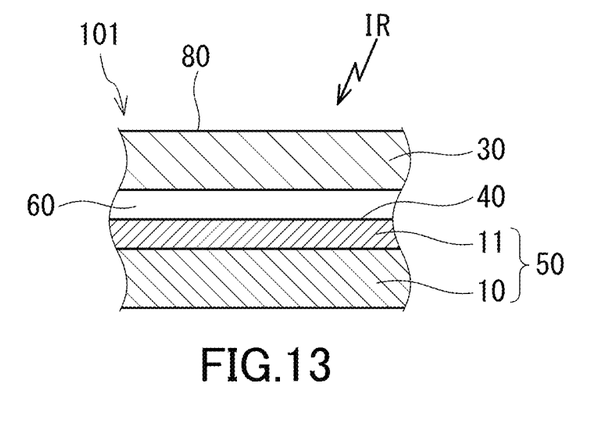
FIG. 13 is a cross-sectional view showing part of another embodiment of the device of the present invention.
Figure 14:
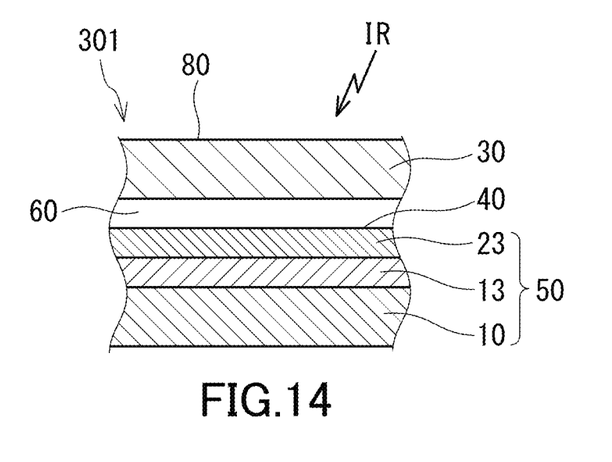
FIG. 14 is a cross-sectional view showing part of yet another embodiment of the device of the present invention.

As shown in FIG. 13 and FIG. 14, the infrared sensing device may further include a cover portion 30 placed at a position through which an infrared ray IR to be incident on the inside of the device is transmitted. The cover portion 30 transmits at least a portion of infrared rays IR, and may block at least a portion of infrared rays IR. In a device 101 shown in FIG. 13, the cover portion 30 is placed to cover at least a portion of the infrared-receiving face 40 of the variable resistance portion 11. In a device 301 shown in FIG. 14, the cover portion 30 is placed to cover at least a portion of the infrared-receiving face 40 of the carrier supply portion 23.

As shown in FIG. 13 and FIG. 14, the variable resistance portion 11 may be supported as a single-layer film by a substrate 10, and the variable resistance portion 13 and the carrier supply portion 23 may be supported as a laminate film by the substrate 10. The substrate 10 and the variable resistance portion 11, or the substrate 10, the variable resistance portion 13, and the carrier supply portion 23 form the variable resistance unit 50. In the variable resistance unit 50, the variable resistance portions 11 and 13 and the carrier supply portion 23 are each in the form of a film. The variable resistance unit 50 may include a film, such as a protective film, an underlayer film, an electrode film, or the like, functioning differently from the variable resistance portion and the carrier supply portion. Adoption of the flexible substrate 10 can impart flexibility to the variable resistance unit 50. The variable resistance unit 50 can be flexible enough, for example, to be wound around the outer circumference of a 10 cm-diameter tube without being broken. It is also possible to make the whole combination of the cover portion 30 and the variable resistance unit 50 as flexible as described above.

In FIG. 13 and FIG. 14, the cover portion 30 is partially spaced from the variable resistance unit 50 such that a gap 60 is provided between the cover portion 30 and the receiving face 40 of the variable resistance portion 11 or that of the carrier supply portion 23. However, the gap 60 is not essential, and the cover portion 30 may be placed in close contact with the infrared-receiving face 40. The cover portion 30 may be detachably placed on the variable resistance unit 50.

In combination with a light source, the infrared sensing device can be used as an absorptance measurement apparatus for measuring the infrared absorptance of a measurement specimen on the basis of a variation in infrared absorptance attributable to placement of the measurement specimen. It is also possible to measure an infrared-absorbing component content in the measurement specimen on the basis of the variation in infrared absorptance. The cover portion 30 desirably transmits at least a portion of infrared rays IR in an embodiment for measuring the infrared absorptance of a measurement specimen. In this case, the cover portion 30 may transmit at least a portion of infrared rays IR, or may transmit infrared rays IR in a substantially entire infrared region.

The material of the cover portion 30 is not particularly limited, and examples thereof include fiber materials such as woven fabrics and non-woven fabrics and plastic materials such as films and resin sheets. An optical filter function, e.g., a band-pass function that allows transmission of light in a given wavelength region including at least a portion of an infrared region, may be added to the cover portion 30.

A surface of the cover portion 30 can be used as a placement or facing face 80 which a measurement specimen is placed on or faces. The face 80 is typically a placement face that is in contact with and supports a measurement specimen. However, a measurement specimen is held above the face 80 without contact with the face 80 depending on the shape and type of the measurement specimen. In this case, the face 80 can be regarded as a facing face that faces the measurement specimen held above the face 80.

The placement or facing face 80 is not limited to a particular embodiment as long as a measurement specimen can be placed on the face 80 or above the face 80. The face 80 may be a face suitable for fixing a measurement specimen or may be a face forming a flow path through which a measurement specimen passes. The face 80 may be a face suitable for being preferentially bonded to a given component included in a measurement specimen to fix only the component. The state of a measurement specimen in contact with the face 80 is not limited to a particular one, either, and may be a solid, a liquid, or a gas.

Figure 15:
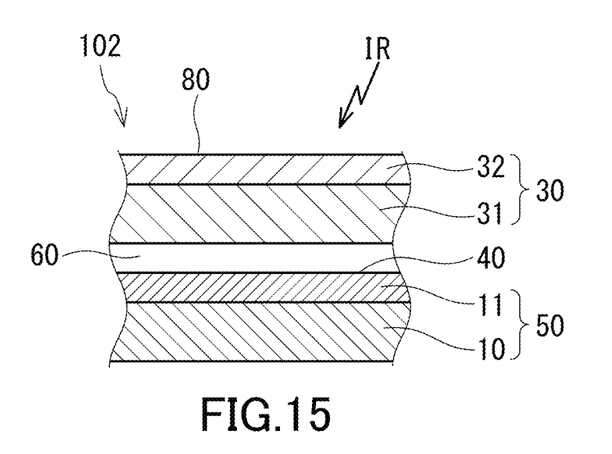
FIG. 15 is a cross-sectional view showing part of yet another embodiment of the device of the present invention.
Figure 16:
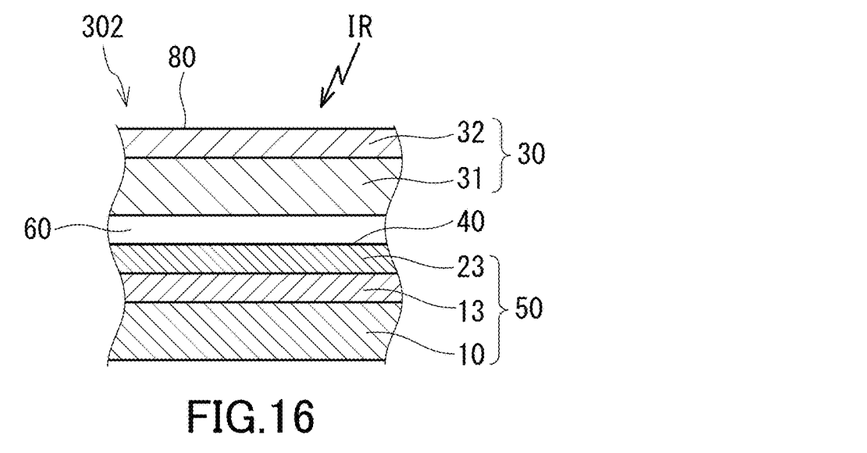
FIG. 16 is a cross-sectional view showing part of yet another embodiment of the device of the present invention.

As shown in FIG. 15 and FIG. 16, the cover portion 30 may include a base 31 and a specimen placement portion 32. The specimen placement portion 32 is supported by the base 31. In a device 102 shown in FIG. 15, the specimen placement portion 32 is placed to cover at least a portion of the infrared-receiving face 40 of the variable resistance portion 11. In a device 302 shown in FIG. 16, the specimen contact portion 32 is placed to cover at least a portion of the infrared-receiving face 40 of the carrier supply portion 23. At least a portion of a surface of the specimen placement portion 32 commonly functions as the placement face 80 supporting a measurement specimen. The specimen placement portion 32 may be placed on a side of the base 31 to face the gap 60, the side being far from a face where infrared light is incident.

The specimen placement portion 32 is not particularly limited, and examples thereof include hydrophobic films, hydrophilic films, biocompatible films, films where antigens are fixed, films where antibodies are fixed, and adhesive films. The specimen contact portion 32 is selected according to the properties of a specimen to be measured. The specimen placement portion 32 itself is formed of a material transmitting at least a portion of infrared rays IR.

Figure 17:
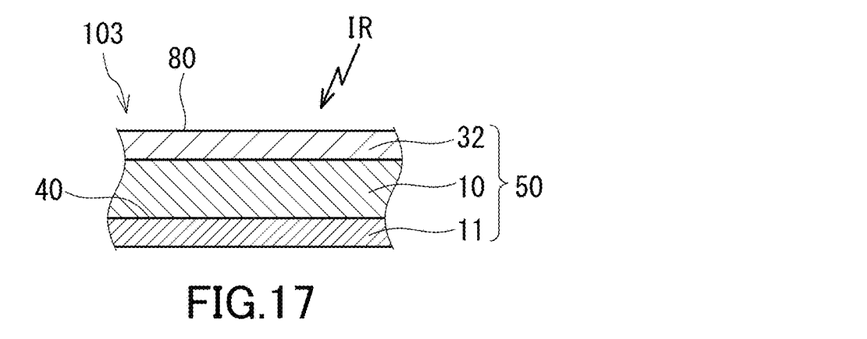
FIG. 17 is a cross-sectional view showing part of yet another embodiment of the device of the present invention.

The specimen placement portion may be placed not as a portion of the cover portion 30 but as a portion of the variable resistance unit 50. In the device 103 shown in FIG. 17, the specimen placement portion 32 is placed on a surface of the substrate 10, the surface being far from a surface where the variable resistance portion 11 is placed. In this example, the substrate 10 is formed of a material transmitting at least a portion of infrared rays IR. In FIG. 17, an exposed surface of the substrate 10 may be defined as the placement or facing face 80, the exposed surface not being provided with the specimen placement portion 32.

The cover portion 30 may include an optical filter portion instead of the specimen placement portion 32 or in addition to the specimen placement portion 32. The optical filter portion can have the above-described optical filter function, namely, the band-pass function that allows transmission of light in a given wavelength region including at least a portion of an infrared region. The cover portion 30 may include the optical filter portion and the specimen placement portion in this order from the base side, or may have a portion having both the optical filter function and a specimen placement function. As described above, the cover portion 30 may include the base 31 and a portion 32 supported by the base 31 and functioning as an optical filter portion and/or a specimen placement portion.

Each infrared sensing device described above can form an apparatus for measuring the infrared transmittance of a measurement specimen in combination with a light source. An infrared transmittance measurement apparatus 500 shown as an example in FIG. 18 includes an infrared sensing device 200 and a light source 400. The above-described sensing devices can be used as the infrared sensing device 200. A light source that emits light including an infrared ray, i.e., a light source that can emit light in a wavelength region including an infrared region may be used as the light source 400. The wavelength region of the light emitted from the light source 400 does not need to span the entire infrared region, and is required to include an infrared ray that can be absorbed by a measurement specimen. Moreover, the light may include ultraviolet light or visible light, or may be light including only a single-wavelength infrared ray, namely, so-called laser light.

Figure 18:
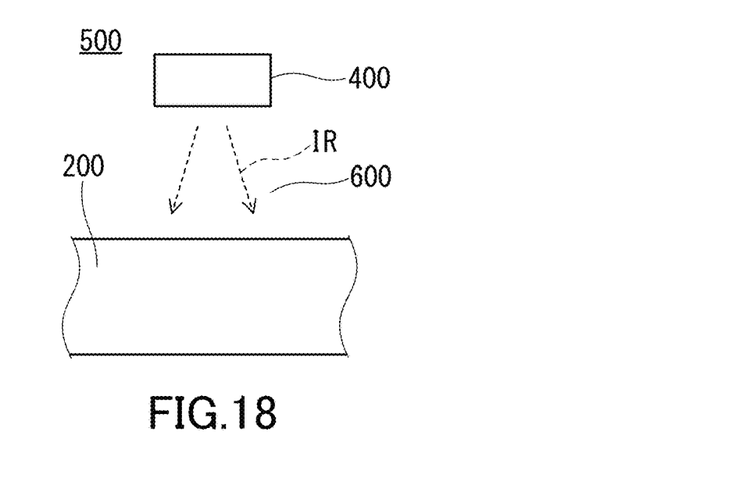
FIG. 18 schematically shows one embodiment of an infrared transmittance measurement apparatus of the present invention.

In the apparatus 500 shown in FIG. 18, a measurement specimen is placed in a specimen holding space 600 between the device 200 and the light source 400. The measurement specimen may be placed in contact with the device 200 or may be spaced from the device 200. In this state, an infrared IR ray emitted from the light source 400 is transmitted through the measurement specimen to be incident on the device 200, and the incident infrared IR ray is measured by the measurement portion of the device 200. After that, for example, an infrared transmittance T1 of the measurement specimen is measured by the calculation portion of the device 200. The infrared absorptance of the measurement specimen is calculated from a difference (T1−T2) from an infrared transmittance T2 measured and calculated in the same manner without the measurement specimen. The calculation portion may calculate the infrared-absorbing component content in the measurement specimen on the basis of T1−T2.

In one example of the measurement, the measurement specimen is blood, and the infrared-absorbing component is glucose. In this example, the measurement specimen may be a portion of a living body, for example, a fingertip or an earlobe. In this example, the blood glucose level in the blood can be calculated on the basis of the absorptance of an infrared ray around 1500 nm transmitted through a living body and characteristically absorbed by glucose, the absorptance being measured for a living body. That is, the infrared transmittance measurement apparatus 500 can be used as a blood glucose meter. This blood glucose meter is a so-called non-invasive sensor, and is also a sensor making use of an advantage, which is a capability of dealing also with a molecule whose concentration and concentration distribution in body vary at high speed, of the device 200. This apparatus can be easily made into a wearable sensor by making use of the flexibility of the variable resistance unit 50.

(LSPR-IR Absorbing Material)

The presence of LSPR of the LSPR-IR absorbing material can be confirmed, for example, by a method for revealing that a change in absorption peak wavelength is linear, the change being obtained by changing the refractive index of an ambient medium. The LSPR-IR absorbing material may be a semiconductor.

The LSPR-IR absorbing material may include at least one selected from the group consisting of an oxide, a phosphide, a sulfide, a selenide, and a telluride, or may include at least one selected from the group consisting of a sulfide, a selenide, and a telluride. However, a material including an oxide is generally suited, for example, to applications where durability such as thermal resistance is required. Additionally, the LSPR-IR absorbing material is preferably doped, and the type of doping is preferably doping with different elements, self-doping, defect doping, etc.

The LSPR-IR absorbing material may include a transparent electrically conductive oxide. Examples of the transparent electrically conductive oxide include tin-doped indium oxide, aluminum-doped indium oxide, cerium-doped indium oxide, aluminum-doped zinc oxide, gallium-doped zinc oxide, indium-doped zinc oxide, indium-doped cadmium oxide, fluorine-indium-doped cadmium oxide, fluorine-doped cadmium oxide, chlorine-doped cadmium oxide, bromine-doped cadmium oxide, cesium-doped molybdenum oxide, antimony-doped tin oxide, fluorine-doped tin oxide, and titanium oxide.

The LSPR-IR absorbing material may include at least one selected from the group consisting of copper sulfide, copper phosphide, copper telluride, copper selenide, ruthenium oxide, rhenium oxide, molybdenum oxide, tungsten oxide, tungsten bronze, and delafossite copper oxide, or may include copper sulfide and/or tungsten oxide. These materials are advantageous because, when these materials are used, it is unnecessary to use a highly toxic semiconductor, such as InGaAs, InSb, or PbS, used as a common infrared sensing device.

Examples of the copper sulfide include those represented by CuS and $Cu_{2-x}S$ ($0<x<1$). Similarly, examples of the copper phosphide include those represented by $Cu_{3-x}P$ ($0<x<1$) and CuP, examples of the copper telluride include those represented by CuTe and $Cu_{2-x}Te$ ($0<x<1$), and examples of the copper selenide include those represented by CuSe and $Cu_{2-x}Se$ ($0<x<1$).

Examples of the ruthenium oxide include those represented by $RuO_2$ and $RuO_{2-x}$ ($0<x<1$). Similarly, examples of the rhenium oxide include those represented by $ReO_2$ and $ReO_{2-x}$ ($0<x<1$), examples of the molybdenum oxide include those represented by $MoO_3$ and $MoO_{3-x}$ ($0<x<1$), and examples of the tungsten oxide include those represented by $WO_3$ and $WO_{3-x}$ ($0<x<1$).

The tungsten bronze is a non-stoichiometric compound formed of tungsten oxide and a metal atom, such as an alkali metal, having entered the tungsten oxide at a non-stoichiometric ratio. Specific examples of the tungsten bronze include $Cs_xWO_3$ ($0<x<1$), $LiWO_3$, $LiCsWO_3$, $LiRbWO_3$, and $LiKWO_3$. Examples of the delafossite copper oxide include $CuAlO_2$, $CuGaO_2$, and $CuCrO_2$.

The LSPR-IR absorbing material is suitably a material whose relaxation time from localized surface plasmon excitation can be 1 ns or longer. The material having such a property is, for example, at least one selected from the group consisting of copper sulfide, copper selenide, and cesium-doped tungsten oxide. However, the material having such a property is not limited to these materials, and an appropriate material can be selected by measuring the relaxation time from localized surface plasmon excitation by time-resolved transient absorption spectroscopy.

Figure 3:
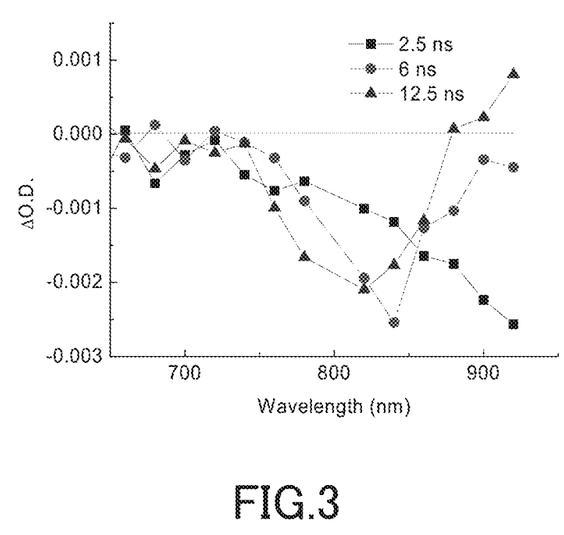
FIG. 3 shows one example of the result of measurement of a relaxation time from localized surface plasmon excitation by time-resolved transient absorption spectroscopy.

FIG. 3 shows an example of a result of measurement of the relaxation time from localized surface plasmon excitation by time-resolved transient absorption spectroscopy. FIG. 3 shows an absorption spectrum obtained 2.5 nanoseconds (ns), 6 ns, and 12.5 ns after the localized surface plasmon excitation. In the absorption spectrum shown in FIG. 3, bleach (negative signal) by the localized surface plasmon excitation can be confirmed in a near-infrared region. In the example shown in FIG. 3, the negative signal remains 2.5 ns, 6 ns, and even 12.5 ns later, which means that the relaxation time is at least 10 ns or longer. A material that can exhibit such a long relaxation time of an active carrier after the excitation of LSPR regardless of the wavelength and intensity of a pump light is suitable as the LSPR-IR absorbing material. It should be noted that the time-resolved transient absorption spectroscopy may be a direct method by which the entire duration of a phenomenon is directly measured.

FIG. 3 shows the measurement result for copper sulfide. This measurement was performed by a pump-probe method using a chloroform solution of copper sulfide as a specimen, a picosecond laser with a wavelength of 1064 nm as a pump light, and a supercontinuum light source as a probe light. The laser light and the probe light are specifically as follows.

Picosecond laser ("PL2210A" manufactured by EKSPLA; repetition frequency: 1 kHz; pulse width: 25 ps; pulse energy: 0.9 mJ (wavelength: 1064 nm))

Supercontinuum light source ("SC450" manufactured by Fianium Ltd.; repetition frequency: 20 MHz; pulse width: 50 to 100 ps)

However, this condition is an example, and an appropriate condition for measurement of the relaxation time from localized surface plasmon excitation can be set according to the material to be measured.

Examples of a desirable combination of the above first material and second material are described below. When the first material is copper sulfide, the second material is desirably, for example, cadmium sulfide. When the first material is tungsten oxide doped with cesium, the second material is desirably, for example, zinc oxide, titanium oxide, tin oxide, or gallium oxide.

The LSPR-IR absorbing material may be nanoparticles. The nanoparticles may be semiconductor nanoparticles, and specifically, may include any of the compounds described above as examples. The variable resistance portion desirably further includes a binder in addition to the nanoparticles. The binder can be present between the nanoparticles and impart a desirable property such as flexibility to the film.

The binder may include a functional group that can be bonded to the nanoparticles, and the functional group is, for example, at least one selected from the group consisting of fluorine (F), chlorine (Cl), bromine (Br), iodine (I), cyanide (CN), thiocyanato (SCN), isothiocyanato (NCS), hydroxide (OH), mercapto (SH), carbonyl (CO), amino ($NR_3$), nitrosyl (NO), nitrito ($NO_2$), phosphane ($PR_3$), carbene ($R_2C$), and pyridine ($NC_5H_5$). The functional group may be an anionic functional group to be bonded to the nanoparticles as an anion, i.e., for example, $F^-$. Each R is independently an optional organic group or a hydrogen atom. As can be understood from the above examples, the functional group that can be bonded to the nanoparticles may be another functional group that can function as a ligand to a metal atom or an anion.

The binder may be an inorganic compound or an organic compound. The binder may be an ion including or formed of any of the functional groups described above as examples, or may be a salt formed of the ion and its counterion. The binder may be a compound having two or more of the above functional groups, the compound being typified by hydrazine ($H_2NNH_2$), ethylenediamine ($H_2NCH_2CH_2NH_2$), 1,2-ethanedithiol ($HSCH_2CH_2SH$, EDT), mercaptopropionic acid ($HSCH_2CH_2COOH$), acetylacetonato ($H_3CCOCHCOCH_3$), and aminobenzonitrile ($NH_2C_6H_4CN$).

The molecular weight of the binder is, for example, 280 or less, even 250 or less, preferably 200 or less, more preferably 100 or less, even more preferably 80 or less, and, in some cases, less than 65. The lower limit of the molecular weight is, for example, but not particularly limited to, 20 or more, or even 30 or more. The use of the binder having not too large a molecular weight is suitable for controlling distances between the nanoparticles to be narrow and controlling the electrical resistance, infrared absorption characteristics, and the like of the variable resistance portion within appropriate ranges.

The amount of the binder may be adjusted as appropriate depending on the type of the binder. The amount of the binder may be, for example, 1% or more, even 2% or more, particularly 3% or more, in some cases 5% or more, and preferably 8% or more in a ratio of the mass of the binder to the sum of the amounts of the nanoparticles and the binder. The upper limit of the amount is not limited to a particular value, and is 30% or less, or even 20% or less.

The above binder is suitable for coordination or adhesion to the nanoparticles. The binder may be a material other than such an adhesive compound. Examples of such material include various types of resins, specifically, polyvinyl alcohol, polyvinyl acetal, polyvinylpyrrolidone, carboxymethyl cellulose, acrylic resin, polyvinyl acetate, polyethylene terephthalate, polystyrene, polyethylene, and the like. Besides, an organic solvent, an electrically conductive polymer, electrically conductive particles, a pH adjuster, a colorant, a thickener, a surfactant, and the like can be used depending on the necessity in film formation, the application, or the like.

When the LSPR-IR absorbing material is the nanoparticles, the variable resistance portion 13 or the carrier supply portion 23 can be formed using the above binder or the like by application, spraying, dipping, or the like (hereinafter referred to as "application or the like"). When used, the binder may coordinate to the nanoparticles by ligand substitution. As describe above, the variable resistance portion 13 or the carrier supply portion 23 as a coating film can be formed by application or the like more easily at a lower price than an infrared sensing device including a bulk semiconductor. In this case, the infrared sensing device can be produced at a low price and the size of the infrared sensing device can be easily increased. Moreover, unlike an infrared sensing device including a bulk semiconductor, a flexible infrared sensing device can be produced by application or the like to a flexible material.

The infrared sensing device can also be included in optical sensors, optical switching devices, and memory devices. These infrared sensing devices can be used for infrared communication. Moreover, the infrared sensing device can be included in thermal sensors, human detection sensors, infrared cameras, thermal imagers, and the like.

Hereinafter, the present invention will be further described by way of examples. The following description is not intended to limit the present invention to specific examples, either.

Example 1

To a three-neck flask were added 1.891 g of copper acetate, 1.13 g of 1,3-dibutyl-2-thiourea, and 10 ml of oleylamine. Nitrogen purge was performed under stirring. Next, the solution temperature was increased to 80° C. using a mantle heater and was maintained for one hour. After that, when the solution temperature decreased to 40° C., 40 ml of chloroform was added little by little to the three-neck flask. The solids in the three-neck flask were dissolved during the addition.

The content of the three-neck flask was transferred into a centrifuge tube. After sufficient dissolution of the solids in the centrifuge tube was confirmed, 40 ml of ethanol was added thereto. Centrifugation was performed at 2000 rpm (rotations/minute) for 10 minutes, and the resulting supernatant solution was immediately discarded. Subsequently, the sediment was dissolved in 5 ml of octane, and 30 ml of ethanol was added thereto. Centrifugation was performed again at a rotational speed of 2000 rpm for 5 minutes, and then the resulting sediment was collected. The mass of the sediment was measured. On the basis of the mass of the sediment, octane was added thereto to a concentration of 200 mg/ml. Copper sulfide nanoparticles were dispersed therein to obtain a first ink.

The first ink contains, in addition to the copper sulfide nanoparticles, oleylamine which is a compound that can coordinate to the copper sulfide nanoparticles. According to thermogravimetric analysis (TGA) of the sediment, a ratio of the mass of the oleylamine to the sum of the amounts of the copper sulfide nanoparticles and the oleylamine is 10%. The ratio is the same in the following examples.

An amount of 50 µl of the first ink was applied using a spin coater onto a glass sheet where an interdigitated array electrode was formed in advance. A coating film was obtained thereby. Before the application, the concentration of the first ink was adjusted to 50 mg/ml. As the glass sheet where an interdigitated array electrode was formed was used a commercially-available product (G-IDEU5 manufactured by DropSens) which had a digit width and a digit-to-digit interval of 5 µm or 10 µm, whose number of digits was 250 (in the case of 5-µm-wide digits) or 125 (in the case of 10-µm-wide digits), and which had a digit length of 6760 µm.

An amount of 200 µl of a solution (a second ink) containing aminobenzonitrile was applied onto the coating film using a spin coater to obtain a thin film that functions as an infrared response sensor. The solvent of the solution was octane, and the aminobenzonitrile concentration was 0.3 mass %. At least a portion of the oleylamine (a first compound) being the compound coordinating to the copper sulfide nanoparticles was substituted by the aminobenzonitrile (a second compound; a binder) by contact with the second ink.

An additional coating film was formed on this coating film by the same film formation method as described above using the first ink, and then substitution of the compound was performed using the second ink by the same method as described above. A thick variable resistance film was obtained in this manner.

Figure 4:
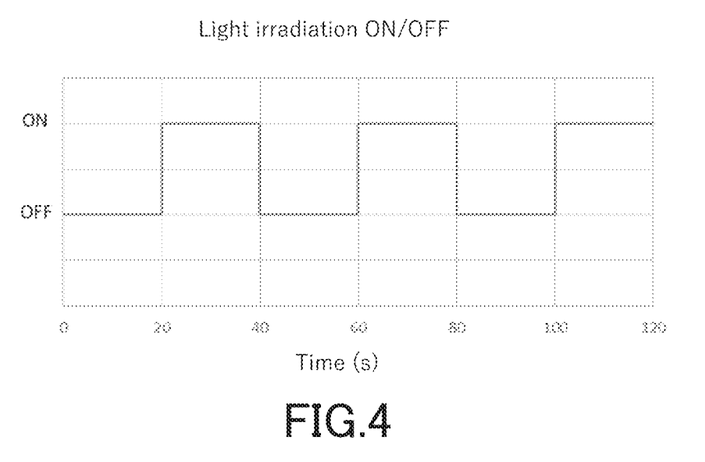
FIG. 4 shows an on/off pattern of light irradiation performed in examples.

The interdigitated array electrode on the glass sheet where the variable resistance film was arranged was connected to a Keithley 2450 source meter as a measurement portion and a 1 V DC power source. The variable resistance film in this state was irradiated with light emitted from a xenon lamp light source manufactured by Eagle Engineering at atmospheric pressure and room temperature, and a current value variation was measured using the source meter. The light emitted from the light source went through a band-pass filter, and the irradiation light was an infrared light with a wavelength of 800 nm or more. The light irradiation was performed using a shutter by repeatedly turning the shutter on and off every 20 seconds. FIG. 4 shows an on/off pattern.

Figure 5:
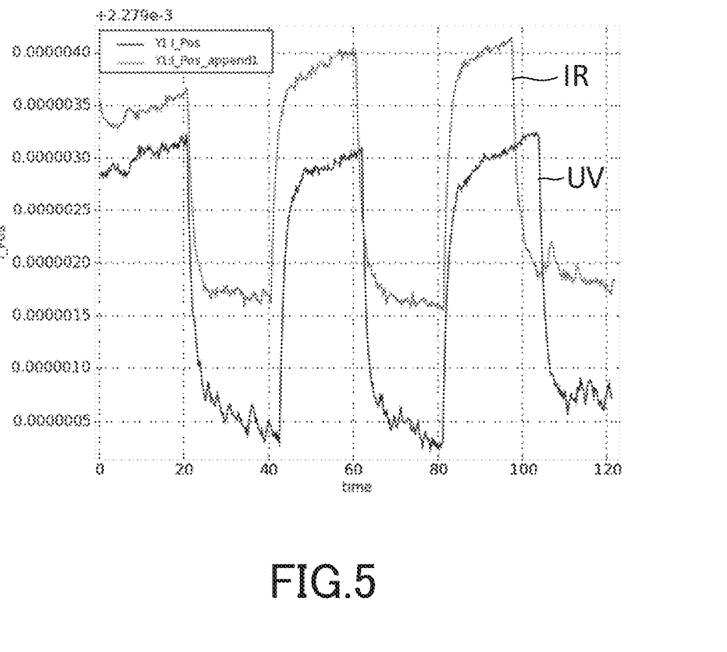
FIG. 5 shows data of electrical resistance variations (variations in current values) obtained in Example 1.
Figure 6:
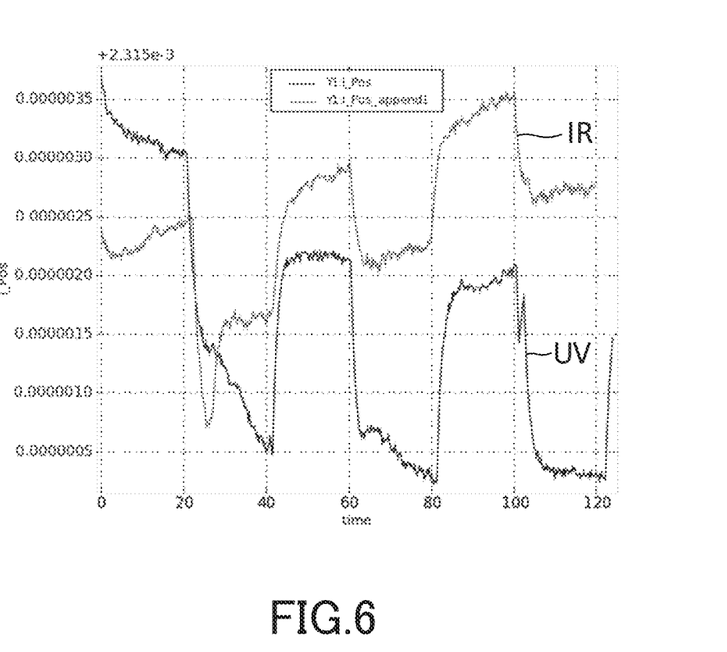
FIG. 6 shows data of electrical resistance variations (variations in current values) obtained in Example 2.
Figure 7:
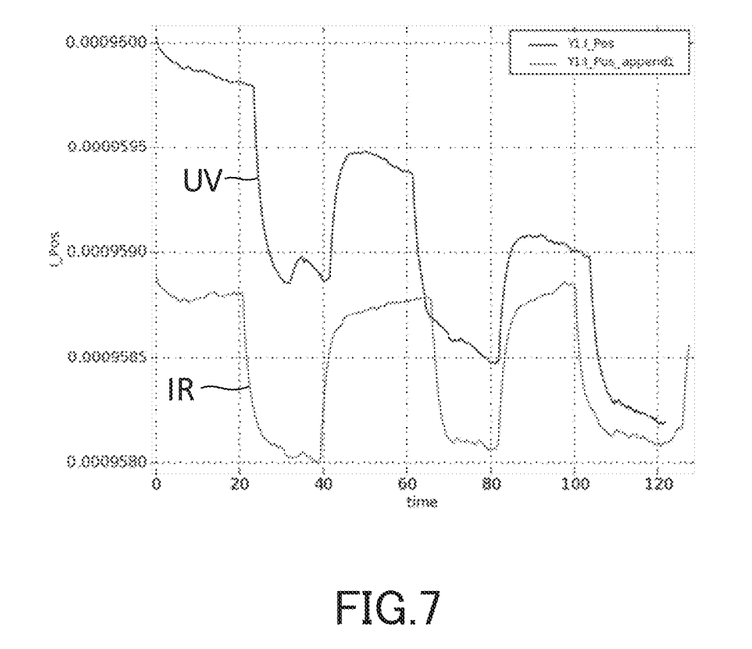
FIG. 7 shows data of electrical resistance variations (variations in current values) obtained in Example 3.
Figure 8:
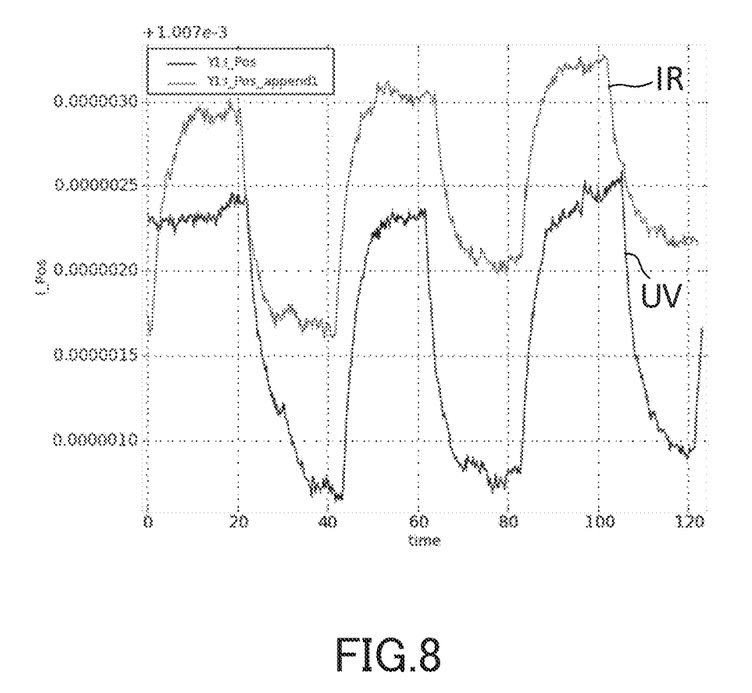
FIG. 8 shows data of electrical resistance variations (variations in current values) obtained in Example 4.
Figure 9:
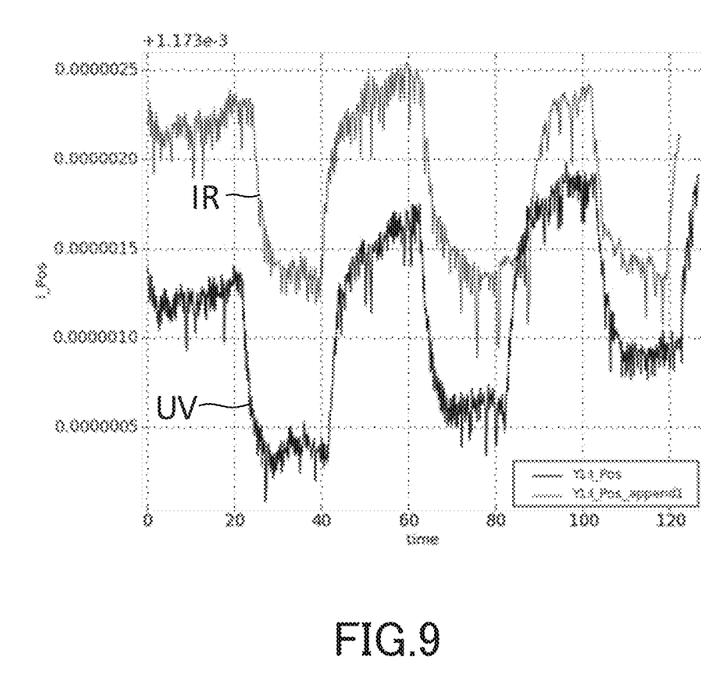
FIG. 9 shows data of electrical resistance variations (variations in current values) obtained in Example 5.
Figure 10:
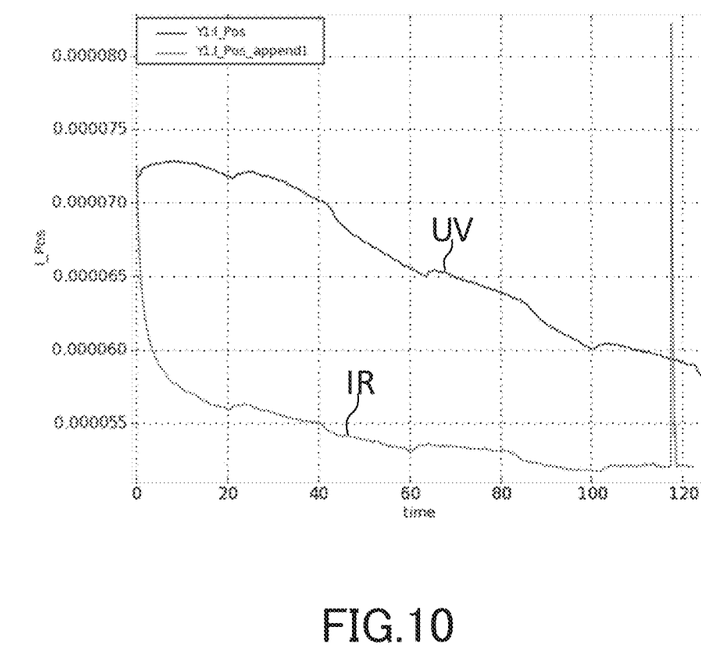
FIG. 10 shows data of electrical resistance variations (variations in current values) obtained in Example 6.

FIG. 5 shows a measured current value variation. FIG. 5 also shows a current value variation obtained when the irradiation light was an ultraviolet light with a wavelength of 450 nm or less.

Examples 2 to 6

Variable resistance films were formed in the same manner as in Example 1, except that the second compound included in the second ink was changed from aminobenzonitrile to compounds shown in Table 1. Each variable resistance film was measured for current value variations under irradiation of the film with infrared (IR) light and ultraviolet (UV) light. FIGS. 6 to 10 show the results.

Example 7

(1) An amount of 50 µl of a cadmium sulfide nanoparticle ink was applied using a spin coater onto a glass sheet as used in Example 1 where an interdigitated array electrode was formed. A coating film was obtained in this manner. Before the application, the concentration of the cadmium sulfide nanoparticle ink was adjusted with octane to 50 mg/ml.

(2) An amount of 200 µl of a solution containing 1,2-ethanedithiol (EDT, a binder) was applied onto the coating film using a spin coater to obtain a thin cadmium sulfide nanoparticle film. The solvent of the solution was acetonitrile, and the EDT concentration was 0.03% on a mass basis.
(3) Then, the operations (1) and (2) were repeated to form a cadmium sulfide nanoparticle film (variable resistance film) having a thickness of 110 nm as a variable resistance film.
(4) An amount of 50 µl of a copper sulfide nanoparticle ink was applied onto the cadmium sulfide nanoparticle film using a spin coater to obtain a coating film. Before the application, the concentration of the copper sulfide nanoparticle ink was adjusted to 100 mg/ml.
(5) An amount of 200 µl of a solution containing 1,2-ethanedithiol (EDT) was applied using a spin coater onto the coating film obtained in (4) to obtain a thin copper sulfide nanoparticle film. The solvent of the solution was acetonitrile, and the EDT concentration was 0.03% on a mass basis.
(6) Then, (4) and (5) were repeated to form a copper sulfide nanoparticle film having a thickness of 30 nm as a carrier supply portion (carrier supply film) on the variable resistance film. It should be noted that cadmium sulfide nanoparticles are commonly an n-type semiconductor material and copper sulfide nanoparticles are commonly a p-type semiconductor material.

Table 1 collectively shows the results for Examples 1 to 7. Table 1 also shows resistance values of the variable resistance portions in a light-unirradiated state.

TABLE 1

| Example | LSPR-IR material | Structure | Binder (molecular weight) | Resistance value ($\Omega$) | Resistance variation in response to start of IR irradiation |
|---|---|---|---|---|---|
| 1 | CuS | FIG. 1 | Aminobenzonitrile (118.1) | 437 | Increase (FIG. 5) |
| 2 | CuS | FIG. 1 | Anisidine (123.2) | 430 | Increase (FIG. 6) |
| 3 | CuS | FIG. 1 | Dimethylphenylenediamine (178.2) | 1000 | Increase (FIG. 7) |
| 4 | CuS | FIG. 1 | Methoxycinnamic acid (178.2) | 990 | Increase (FIG. 8) |
| 5 | CuS | FIG. 1 | Potassium thiocyanate (60.1)[1] | 850 | Increase (FIG. 9) |
| 6 | CWO | FIG. 1 | Succinic acid (118.1) | 14820 | Decrease (FIG. 10) |
| 7[2] | CuS | FIG. 2 | 1,2-Ethanedithiol (94.2) | 115 | Decrease (FIG. 11) |

[1]The molecular weight of potassium thiocyanate is of a thiocyanic acid part ($SCN^-$) only.
[2]Example 7: The carrier supply portion includes CuS, and the variable resistance portion includes CdS.

Figure 11:
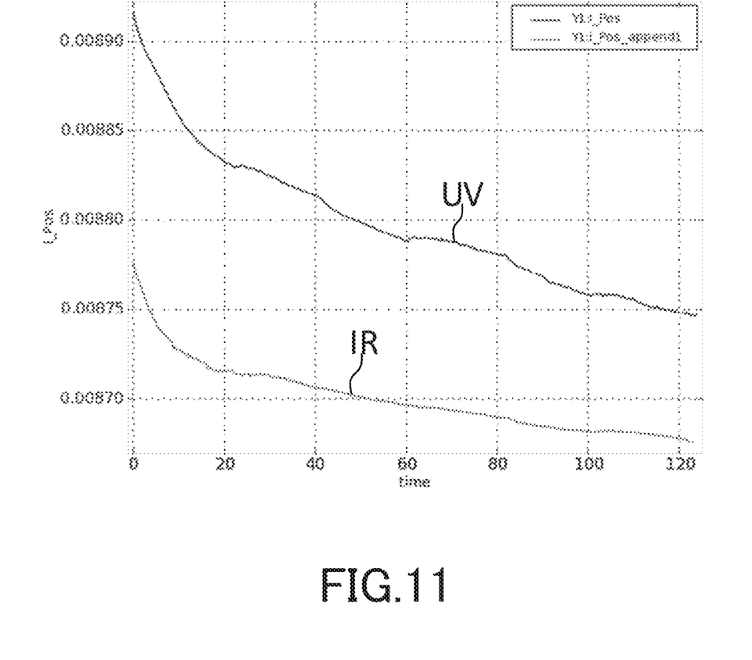
FIG. 11 shows data of electrical resistance variations (variations in current values) obtained in Example 7.

The measured resistance value variation was very small in some of Examples (e.g., FIG. 11). However, the small variation itself does not adversely affect use as a sensing device because the small variation can be amplified by a known method as needed.

Figure 12:
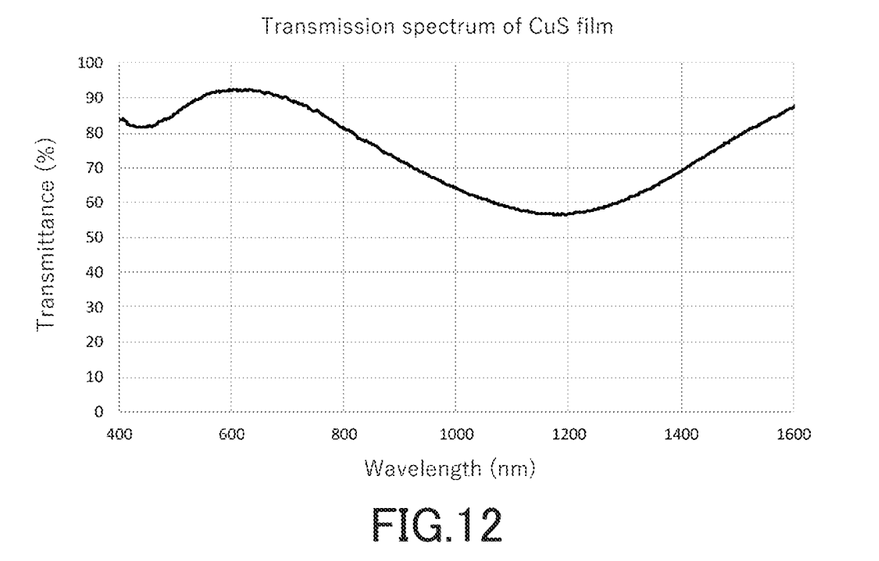
FIG. 12 shows data of a spectral transmittance of a variable resistance film obtained in Example 4.

A transmission spectrum of the variable resistance film of Example 4 was measured. FIG. 12 shows the result. FIG. 12 confirms that there is an absorption region in a near-infrared region and that a transmittance of 80% or more is achieved in the visible region between the wavelengths of 400 and 800 nm.

The invention claimed is:
1. An infrared sensing device comprising:
a variable resistance portion whose electrical resistance varies in response to irradiation of the infrared sensing device with an infrared ray; and
a detection portion that detects the variation of the electrical resistance of the variable resistance portion, wherein
the variable resistance portion includes a material potentially absorbing an infrared ray by localized surface plasmon resonance,
the variable resistance portion is a single layer film,
the detection portion includes an electrode group that applies voltage to the variable resistance portion,
the electrode group includes a first electrode and a second electrode, the first electrode being electrically connected to a positive electrode of a power source, the second electrode being electrically connected to a negative electrode of the power source, and
both the first electrode and the second electrode are in direct contact with the variable resistance portion.
2. The infrared sensing device according to claim 1, wherein
in the case where irradiation of the variable resistance portion with an infrared ray starts and then stops during application of voltage from the electrode group to the variable resistance portion, the electrical resistance increases in response to the start of the irradiation and the electrical resistance decreases in response to the stop of the irradiation.
3. The infrared sensing device according to claim 2, wherein the variable resistance portion includes, as the material, a compound including copper and a chalcogen element excluding oxygen.
4. The infrared sensing device according to claim 3, wherein the variable resistance portion includes, as the material, nanoparticles of copper sulfide.
5. The infrared sensing device according to claim 1, wherein
in the case where irradiation of the variable resistance portion with an infrared ray starts and then stops during application of voltage from the electrode group to the variable resistance portion, the electrical resistance decreases in response to the start of the irradiation and the electrical resistance increases in response to the stop of the irradiation.
6. The infrared sensing device according to claim 1, wherein the material potentially absorbing an infrared ray by localized surface plasmon resonance is a material for which 1 ns or longer can be measured as a relaxation time of an active carrier from localized surface plasmon excitation.

7. The infrared sensing device according to claim 1, wherein the variable resistance portion includes a first material being the material potentially absorbing an infrared ray by localized surface plasmon resonance and a second material receiving a carrier being an electron and/or a hole, the carrier being generated by irradiation of the first material with an infrared ray.

8. The infrared sensing device according to claim 7, wherein the first material and the second material are each a transparent electrically conductive oxide.

9. The infrared sensing device according to claim 1, further comprising a heat release member that releases heat of the variable resistance portion to an outside of the device.

10. An infrared sensing device comprising:
a variable resistance portion whose electrical resistance varies in response to irradiation of the infrared sensing device with an infrared ray;
a carrier supply portion including a semiconductor material potentially absorbing an infrared ray by localized surface plasmon resonance and being in contact with the variable resistance portion; and
a detection portion that detects the variation of the electrical resistance of the variable resistance portion, wherein
the variable resistance portion receives a carrier from the carrier supply portion, the carrier being an electron and/or a hole, the carrier being generated by irradiation of the carrier supply portion with an infrared ray,
the detection portion includes an electrode group that applies voltage to the variable resistance portion,
the electrode group includes a first electrode and a second electrode, the first electrode being electrically connected to a positive electrode of a power source, the second electrode being electrically connected to a negative electrode of the power source, and
both the first electrode and the second electrode are in direct contact with the variable resistance portion.

11. The infrared sensing device according to claim 10, wherein
in the case where irradiation of the variable resistance portion with an infrared ray starts and then stops during application of voltage from the electrode group to the variable resistance portion, the electrical resistance increases in response to the start of the irradiation and the electrical resistance decreases in response to the stop of the irradiation.

12. The infrared sensing device according to claim 10, wherein
in the case where irradiation of the variable resistance portion with an infrared ray starts and then stops during application of voltage from the electrode group to the variable resistance portion, the electrical resistance starts to decrease in response to the start of the irradiation and the electrical resistance starts to increase in response to the stop of the irradiation.

13. The infrared sensing device according to claim 12, wherein the carrier supply portion and the variable resistance portion form a laminate structure.

14. The infrared sensing device according to claim 13, wherein the carrier supply portion and the variable resistance portion are formed of different semiconductor materials.

15. The infrared sensing device according to claim 12, wherein the variable resistance portion includes, as the material, nanoparticles of cesium-doped tungsten oxide.

16. The infrared sensing device according to claim 10, wherein the material potentially absorbing an infrared ray by localized surface plasmon resonance is a material for which 1 ns or longer can be measured as a relaxation time of an active carrier from localized surface plasmon excitation.

17. An infrared transmittance measurement apparatus comprising:
the infrared sensing device according to claim 1; and
a light source that irradiates the infrared sensing device with light including an infrared ray, wherein
the infrared sensing device detects an infrared ray having been emitted by the light source to irradiate a measurement specimen and having been transmitted through the measurement specimen.

18. An infrared transmittance measurement apparatus comprising:
the infrared sensing device according to claim 10; and
a light source that irradiates the infrared sensing device with light including an infrared ray, wherein
the infrared sensing device detects an infrared ray having been emitted by the light source to irradiate a measurement specimen and having been transmitted through the measurement specimen.

* * * * *